(12) United States Patent
Arafat et al.

(10) Patent No.: US 11,777,437 B2
(45) Date of Patent: Oct. 3, 2023

(54) FAULT TOLERANT OPERATIONS OF A SIX-PHASE MACHINE

(71) Applicant: Cummins Inc., Columbus, IN (US)

(72) Inventors: Akm Arafat, Blaine, MN (US); Dakshina S. Murthy-Bellur, Plymouth, MN (US)

(73) Assignee: CUMMINS INC., Columbus, IN (US)

( * ) Notice: Subject to any disclaimer, the term of this patent is extended or adjusted under 35 U.S.C. 154(b) by 0 days.

(21) Appl. No.: 17/623,745

(22) PCT Filed: Jul. 20, 2020

(86) PCT No.: PCT/US2020/042770
§ 371 (c)(1),
(2) Date: Dec. 29, 2021

(87) PCT Pub. No.: WO2021/016183
PCT Pub. Date: Jan. 28, 2021

(65) Prior Publication Data
US 2022/0247340 A1    Aug. 4, 2022

Related U.S. Application Data

(60) Provisional application No. 62/878,421, filed on Jul. 25, 2019.

(51) Int. Cl.
*H02P 29/024* (2016.01)
*G01R 31/34* (2020.01)
*H02P 25/22* (2006.01)

(52) U.S. Cl.
CPC ........ *H02P 29/0243* (2016.02); *G01R 31/343* (2013.01); *H02P 25/22* (2013.01)

(58) Field of Classification Search
CPC .... H02P 29/0243; H02P 25/22; G01R 31/343
(Continued)

(56) References Cited

U.S. PATENT DOCUMENTS 6,459,999 B1    10/2002   Krietemeier
7,990,098 B2 *   8/2011   Perisic ................... B60L 50/61
                                                          363/55

(Continued)

OTHER PUBLICATIONS

International Search Report and Written Opinion for International patent application No. PCT/US2020/42770, filed Jul. 20, 2020, dated Nov. 5, 2020. Retrieved from the Internet: <URL: http://researchonline.ljmu.ac.uk/id/eprint/1716/>; IEEE; figure 1, I. Introduction, A. Effect of Fault on Machine Equations, B. Modes of Operation, V. Controller for Post-Fault Operation, VI. Experimental Results, C. Post-fault Operation.

(Continued)

*Primary Examiner* — David Luo
(74) *Attorney, Agent, or Firm* — Faegre Drinker Biddle & Reath LLP

(57) ABSTRACT

A method of operating a multi-phase electric machine includes operating a six-phase machine with six phases that are configured into a first group having a first neutral connection and a second group having a second neutral connection. The method also includes determining whether at least one of the six phases is experiencing a fault. In response to the determining, the method includes combining the first and second neutral connections to form a common neutral connection to continue operating the six-phase machine by using the remaining phase not experiencing the fault.

15 Claims, 4 Drawing Sheets

(58) Field of Classification Search
USPC .................................................. 318/445, 558
See application file for complete search history.

(56) References Cited

U.S. PATENT DOCUMENTS

| | | | |
|---|---|---|---|
| 8,283,881 | B2 | 10/2012 | Gallegos-Lopez |
| 8,305,025 | B2* | 11/2012 | Jackson .................. H02P 27/06 |
| | | | 318/730 |
| 8,649,130 | B2* | 2/2014 | Horikoshi ........... H02P 29/0241 |
| | | | 361/23 |
| 9,088,231 | B2 | 7/2015 | Schulz |
| 9,425,726 | B2 | 8/2016 | Kanjiya |
| 9,787,237 | B2 | 10/2017 | Choi |
| 9,985,566 | B2* | 5/2018 | Jiang ..................... H02M 7/493 |
| 2010/0026276 | A1 | 2/2010 | Wunderlich |
| 2016/0352278 | A1 | 12/2016 | Jiang |
| 2018/0022576 | A1 | 1/2018 | Jiang et al. |
| 2019/0006973 | A1 | 1/2019 | Zhou |
| 2019/0068103 | A1 | 2/2019 | Mao |

OTHER PUBLICATIONS

Che, H et al. "Post-Fault operation of an Asymmetrical Six-Phase Induction Machine with Single and Two Isolated Neutral Points"; Nov. 15, 2013 [retrieved Sep. 24, 2020]. Re.

* cited by examiner

FAULT TOLERANT OPERATIONS OF A SIX-PHASE MACHINE

CROSS-REFERENCE TO RELATED APPLICATIONS

This present application is a national phase application of International Application No. PCT/US2020/042770, filed on Jul. 20, 2020, which claims priority to U.S. Provisional Application No. 62/878,421, filed on Jul. 25, 2019, and entitled "FAULT TOLERANT OPERATIONS OF A SIX-PHASE MACHINE," the entire disclosure of which is expressly incorporated by reference herein.

FIELD OF THE DISCLOSURE

The present disclosure generally relates to multi-phase electric machines, and more particularly to techniques for controlling the operation of a six-phase machine when one or more phases have experienced a fault or failed.

BACKGROUND OF THE DISCLOSURE

Multi-phase electric machines are utilized in various applications including electric vehicles. For example, a drive system of an electric vehicle typically includes an alternating current (AC) electric motor driven by a direct current (DC) power source (e.g., a main battery). The AC electric motor is coupled to the DC power source via a power inverter that performs switching functions to convert the DC power to AC power. One example of a multi-phase electric machine is a six-phase AC machine. In situations where one or more phases of the six-phase AC machine fail, it is important to make sure that the remaining phases can still operate to provide the needed torque/power. Accordingly, there remains a need to develop techniques for controlling the operation of a six-phase AC machine when one or more phases have experienced a fault/failure condition.

SUMMARY

According to one embodiment, the present disclosure provides a method by a controller to operate a six-phase machine with six phases configured into a first group having a first neutral connection and a second group having a second neutral connection. The method includes determining whether at least one of the six phases is experiencing a fault. In response to determining that at least one of the six phases is experiencing a fault, the method includes combining the first and second neutral connections to form a common neutral connection to continue operating the six-phase machine by using the remaining phases not experiencing the fault. In one example, combining the first and second neutral connections includes operating a switch to connect the first and second neutral connections into the common neutral connection.

In a further aspect, the fault occurs in one phase in either the first group or the second group. As such, operating the six-phase machine by using the remaining phases includes operating the six-machine as a five-phase machine. In another aspect, the fault occurs in one phase in both the first group and the second group. As such, operating the six-phase machine by using the remaining phases includes operating the six-machine as a four-phase machine.

In still another aspect, the method includes detecting a fault condition causing the fault and generating a signal to indicate the fault condition. Moreover, operating the six-phase machine by using the remaining phases includes providing a current to generate a modified magnetomotive force to approximate a magnetomotive force that was generated by the six-phase machine before the occurrence of the fault.

According to another embodiment, the present disclosure provides a controller that includes a processor and a memory. The memory includes instructions that, when executed by the processor, cause the controller to operate a six-phase machine with six phases that are configured into a first group having a first neutral connection and a second group having a second neutral connection. The processor also causes the controller to determine whether at least one of the six phases is experiencing a fault. In response to determining that at least one of the six phases is experiencing a fault, the processor causes the controller to combine the first and second neutral connections to form a common neutral connection to continue operating the six-phase machine by using the remaining phases not experiencing the fault. In one example, combining the first and second neutral connections includes the processor causing the controller to operate a switch to connect the first and second neutral connections into the common neutral connection.

In a further aspect, the fault occurs in one phase in either the first group or the second group. As such, the processor causes the controller to operate the six-phase machine as a five-phase machine. In another aspect, the fault occurs in one phase in both the first group and the second group. As such, the processor causes the controller to operate the six-machine as a four-phase machine.

In still another aspect, the processor causes the controller to detect a fault condition causing the fault and generate a signal to indicate the fault condition. Moreover, the processor causes the controller to provide a current to generate a modified magnetomotive force to approximate a magnetomotive force that was generated by the six-phase machine before the occurrence of the fault.

According to yet another embodiment, the present disclosure provides a system that includes a six-phase machine and a controller coupled to the six-phase machine. The six-phase machine has six phases that are configured into a first group having a first neutral connection and a second group having a second neutral connection. The controller is configured to operate the six-phase machine and determine whether at least one of the six phases is experiencing a fault. In response to determining that at least one of the six phases is experiencing a fault, the controller is configured to combine the first and second neutral connections to form a common neutral connection to continue operating the six-phase machine by using the remaining phases not experiencing the fault.

In a further aspect, the fault occurs in one phase in either the first group or the second group. As such, the controller is configured to operate the six-machine as a five-phase machine. In another aspect, the fault occurs in one phase in both the first group and the second group. As such, the controller is configured to operate the six-machine as a four-phase machine.

In still another aspect, the controller is configured to detect a fault condition causing the fault and generate a signal to indicate the fault condition. In yet another aspect, the system further includes a switch and the controller is configured to combine the first and second neutral connections by operating the switch to connect the first and second neutral connections into the common neutral connection. Moreover, the controller is configured to provide a current to generate a modified magnetomotive force to approximate a magnetomotive force that was generated by the six-phase machine before the occurrence of the fault.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the disclosure and such exemplifications are not to be construed as limiting the scope of the disclosure in any manner.

DETAILED DESCRIPTION

Figure 1:
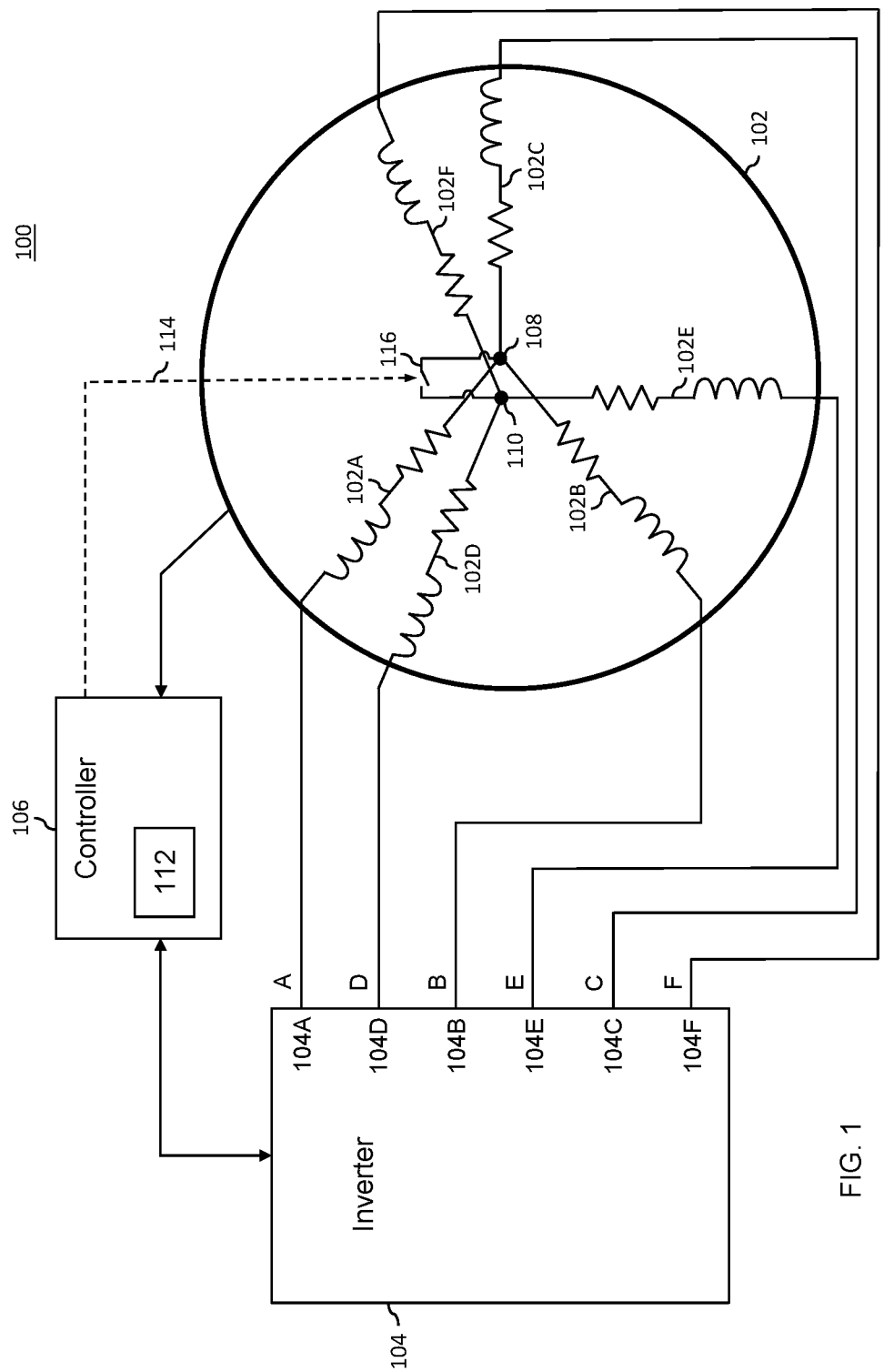
FIG. 1 is a block diagram illustrating a six-phase machine.

For the purposes of promoting an understanding of the principles of the present disclosure, reference is now made to the embodiments illustrated in the drawings, which are described below. The exemplary embodiments disclosed herein are not intended to be exhaustive or to limit the disclosure to the precise form disclosed in the following detailed description. Rather, these exemplary embodiments were chosen and described so that others skilled in the art may utilize their teachings.

The terms "couples," "coupled," and variations thereof are used to include both arrangements wherein two or more components are in direct physical contact and arrangements wherein the two or more components are not in direct contact with each other (e.g., the components are "coupled" via at least a third component), but yet still cooperate or interact with each other.

Throughout the present disclosure and in the claims, numeric terminology, such as first and second, is used in reference to various components or features. Such use is not intended to denote an ordering of the components or features. Rather, numeric terminology is used to assist the reader in identifying the component or features being referenced and should not be narrowly interpreted as providing a specific order of components or features.

One of ordinary skill in the art will realize that the embodiments provided can be implemented in hardware, software, firmware, and/or a combination thereof. Programming code according to the embodiments can be implemented in any viable programming language such as C, C++, HTML, XTML, JAVA or any other viable high-level programming language, or a combination of a high-level programming language and a lower level programming language.

Referring now to FIG. 1, a block diagram of a six-phase system 100 is shown including a six-phase AC machine 102, an inverter 104, and a controller 106. Controller 106 controls the operation of six-phase AC machine 102 via inverter 104 such that six-phase AC machine 102 can use DC power inputs provided to inverter 104. As used herein, the term "AC machine" refers to an AC powered device that converts electrical energy to mechanical energy or vice versa. AC machines can be classified into synchronous AC machines and asynchronous AC machines. Synchronous AC machines can include permanent magnet machines and reluctance machines. In one implementation, six-phase AC machine 102 is a six-phase asymmetric permanent magnet synchronous AC motor used to provide torque in an electric vehicle. However, it should be appreciated that the disclosed embodiments can relate to other types of multi-phase electric machines in the context of other applications.

Six-phase AC machine 102 has six windings 102A, 102B, 102C, 102D, 102E and 102F connected to terminals 104A, 104B, 104C, 104D, 104E and 104F, respectively of inverter 104. Each winding 102A-102F is associated with a respective phase A-F of six-phase AC machine 102. Windings 102A-102F are configured into a first group that includes windings 102A-102C, and a second group that includes windings 102D-102F. The first group of windings are coupled together at a first neutral connection 108. As such, currents flowing into winding 102A can flow out of windings 102B, 102C, currents flowing into winding 102B can flow out of windings 102A, 102C, and currents flowing into winding 102C can flow out of windings 102A, 102B. Similarly, the second group of windings are coupled together at a second neutral connection 110. Thus, currents flowing into winding 102D can flow out of windings 102E, 102F, currents flowing into winding 102E can flow out of windings 102D, 102F, and currents flowing into winding 102F can flow out of windings 102D, 102E.

First and second neutral connections 108, 110 are electrically isolated making six-phase AC machine 102 asymmetric in nature. With this configuration, six-phase AC machine 102 is set up like two individual three-phase machines. The two groups of windings are shifted from one another by a certain degree (e.g., 30 degrees) to improve torque performance. Windings 102A-102F represent a stator of six-phase AC machine 102. For ease of illustration, the stator and other components (e.g., rotor, shaft, etc.) of six-phase AC machine 102 are not shown. Generally, the rotor is mounted to the shaft and the rotor is separated from the stator by an air gap. When utilized as a motor, the stator causes the rotor to rotate utilizing electrical energy thereby rotating the shaft to provide mechanical energy. On the other hand, when utilized as a generator, the shaft is rotated by an external mechanical force that causes the rotor to rotate thereby causing the stator to generate electrical energy.

Inverter 104 includes, among other things, switching devices (e.g., transistors, diodes, etc.) to appropriately switch DC voltages and provide energization to windings 102A-102F of six-phase AC machine 102 as known to those skilled in the art. In one example, inverter 104 may be a pulse width modulated inverter.

Controller 106 receives operating signals from six-phase AC machine 102 and generates control signals to control the switching operations of inverter 104 to thereby control the outputs (e.g., currents) provided to windings 102A-102F. Controller 106 also includes a fault detection unit 112 that receives information associated with inverter 104 and/or six-phase AC machine 102 to determine faults. For example, fault detection unit 112 may receive information from sensors (e.g., current sensors) indicating various characteristics of the currents provided by inverter 104 to windings 102A-102F (e.g., amplitude measurements, root mean square measurements, etc.). As another example, fault detection unit 112 may receive information from sensors indicating the conditions of windings 102A-102F. Fault detection unit 112 then processes the received information and determines whether a fault condition or failure condition has occurred with respect to one or more phases (e.g., phases A-F) in six-phase AC machine 102. While FIG. 1 shows fault detection unit 112 as being a part of controller 106, in other embodiments, fault detection unit 112 can be a separate unit that is communicatively coupled to controller 106.

In one example, fault detection unit 112 determines a fault in a phase (e.g., phase A) of six-phase AC machine 102 when an open circuit condition is detected between the terminal in inverter 104 (e.g., 104A) and the corresponding winding (e.g., 102A) in six-phase AC machine 102. The open circuit condition may occur due to factors such as a physical disconnection (e.g., broken wires) and/or damage to the winding. In another example, fault detection unit 112 determines a fault in a phase when one or more switching devices in inverter 104 associated with that phase are turned off or are operating in a faulty manner. This may be due to factors such as failures or malfunctions in the electronic circuitry. Once a fault is determined by fault detection unit 112, fault detection unit 112 generates information (e.g., a fault signal) to indicate the fault. The information can indicate a fault condition causing the fault and/or which phase(s) are presently experiencing the fault or have failed. In some implementations, fault detection unit 112 provides a fault signal to an output unit (e.g., a display, an indicator light, a speaker, etc.) to indicate the detected fault to an observer (e.g., an operator of an electric vehicle).

In some embodiments, controller 106 may include a non-transitory memory having instructions that, in response to execution by a processor, cause the processor to perform the functions of controller 106 and/or fault detection unit 112 as described above. The processor, non-transitory memory and controller 106 are not particularly limited and can, for example, be physically separate.

In some embodiments, controller 106 can form a portion of a processing subsystem including one or more computing devices having memory, processing, and communication hardware. Controller 106 can be a single device or a distributed device, and functions of controller 106 can be performed by hardware and/or as computer instructions on a non-transient computer readable storage medium, such as the non-transitory memory.

In some embodiments, controller 106 includes one or more interpreters, determiners, evaluators, regulators, and/or processors that functionally execute the operations of controller 106. Interpreters, determiners, evaluators, regulators, and processors can be implemented in hardware and/or as computer instructions on a non-transient computer readable storage medium, and can be distributed across various hardware or computer-based components.

The configuration of six-phase AC machine 102 as two three-phase machines in FIG. 1 has some inherent advantages. For example, one advantage is that when a fault occurs in one of the three-phase machines, the other three-phase machine will not be affected. That is, the other three-phase machine can continue to run, and the machine will not be completely shut down. Another advantage is that there may be less torque ripples by having two three-phase machines. However, a major disadvantage is when one of the three-phase machines experiences a faulty phase, that three-phase machine must be shut down entirely. Thus, under any single-phase fault, six-phase AC machine 102 would lose approximately 50% of the electromagnetic action and hence 50% of the torque. This limits the optimal use of the six-phase configuration.

To get the best use of six-phase AC machine 102 under any single-phase fault, six-phase AC machine 102 can be configured to continue operating by using all the remaining unaffected phases. To do so, controller 106 generates a control signal 114 to close a switch 116 in response to determining the occurrence of a fault in a phase. By closing switch 116, first and second neutral connections 108, 110 are joined together to form a common neutral connection. In this manner, under a single-phase fault, all the remaining unaffected phases will be in electromagnetic action to try to maintain the torque.

Generally, a fault may occur in one or more phases. Table 1 illustrates the various scenarios in which a fault may occur, and the action taken by controller 106 to form a common neutral connection.

TABLE 1

|  | Windings A, B, C | Windings D, E, F | Action |
|---|---|---|---|
| Phases at Fault | A | None | Form Common Neutral |
|  | A, B | None | Form Common Neutral |
|  | A | D | Form Common Neutral |
|  | A, B | D | Form Common Neutral |
|  | A | D, E | Form Common Neutral |
|  | None | D, E | Form Common Neutral |

Figure 2:
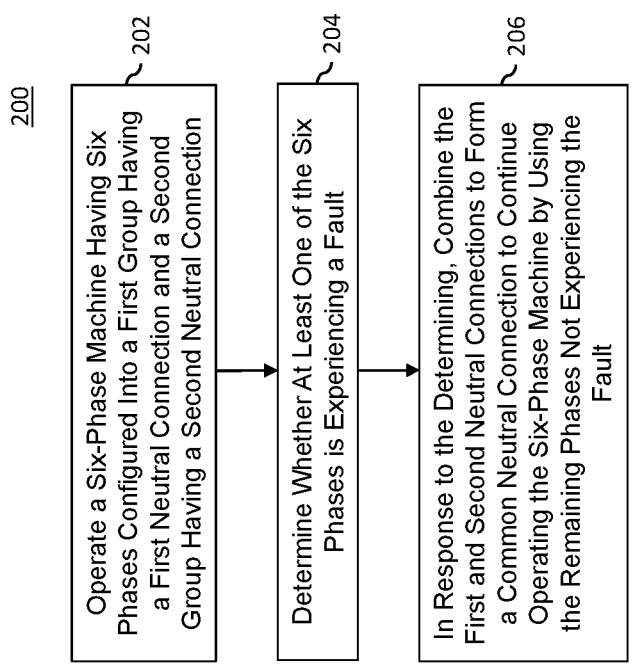
FIG. 2 is a flow chart illustrating a method for operating the six-phase machine of FIG. 1.

Referring now to FIG. 2, a method 200 for operating a six-phase machine (e.g., 102) is shown. Method 200 can be performed by a controller (e.g., 106). At block 202, the controller is initially operating the six-phase machine, which has six phases (e.g., A-F) configured into a first group having a first neutral connection (e.g., 108) and a second group having a second neutral connection (e.g., 110).

At block 204, the controller determines whether at least one of the six phases is experiencing a fault. The controller includes or can communicate with a fault detection unit (e.g., 112) to determine a fault condition that is causing the fault (e.g., an open circuit fault condition). The controller can generate a signal to indicate the fault condition.

At block 206, in response to determining that a fault has occurred in at least one of the six phases, the controller combines the first and second neutral connections to form a common neutral connection to continue operating the six-phase machine by using the remaining phases that are not experiencing the fault. Combining the first and second neutral connections entails operating a switch (e.g., 116) to connect the first and second neutral connections into the common neutral connection.

Figure 3:
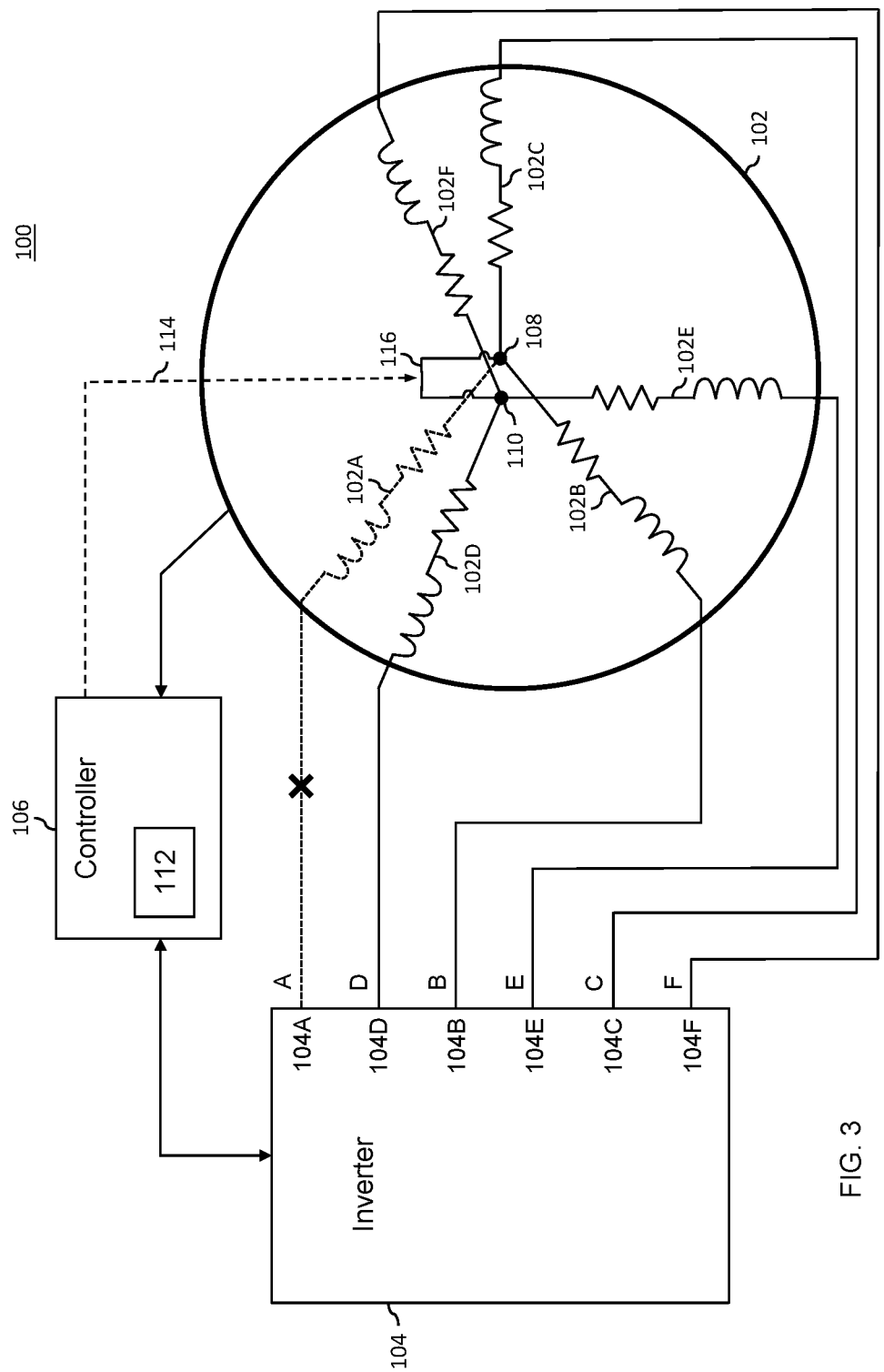
FIG. 3 is a block diagram illustrating a fault occurring in one of the six phases in the six-phase machine of FIG. 1.

In one example, the fault occurs in one phase in either the first group or the second group. As such, the controller combines the first and second neutral connections and operates the six-machine as a five-phase machine. As an illustration, FIG. 3 shows a fault occurring in phase A (winding 102A) of six-phase AC machine 102. As a result, controller 106 generates signal 114 to close switch 116. In doing so, neutral connections 108, 110 are joined together to form a common neutral connection. Using the common neutral connection, controller 106 can control the currents flowing through other phases B, C, D, E, F (windings 102B, 102C, 102D, 102E, 102F) and operate six-phase AC machine 102 in a five-phase configuration.

Figure 4:
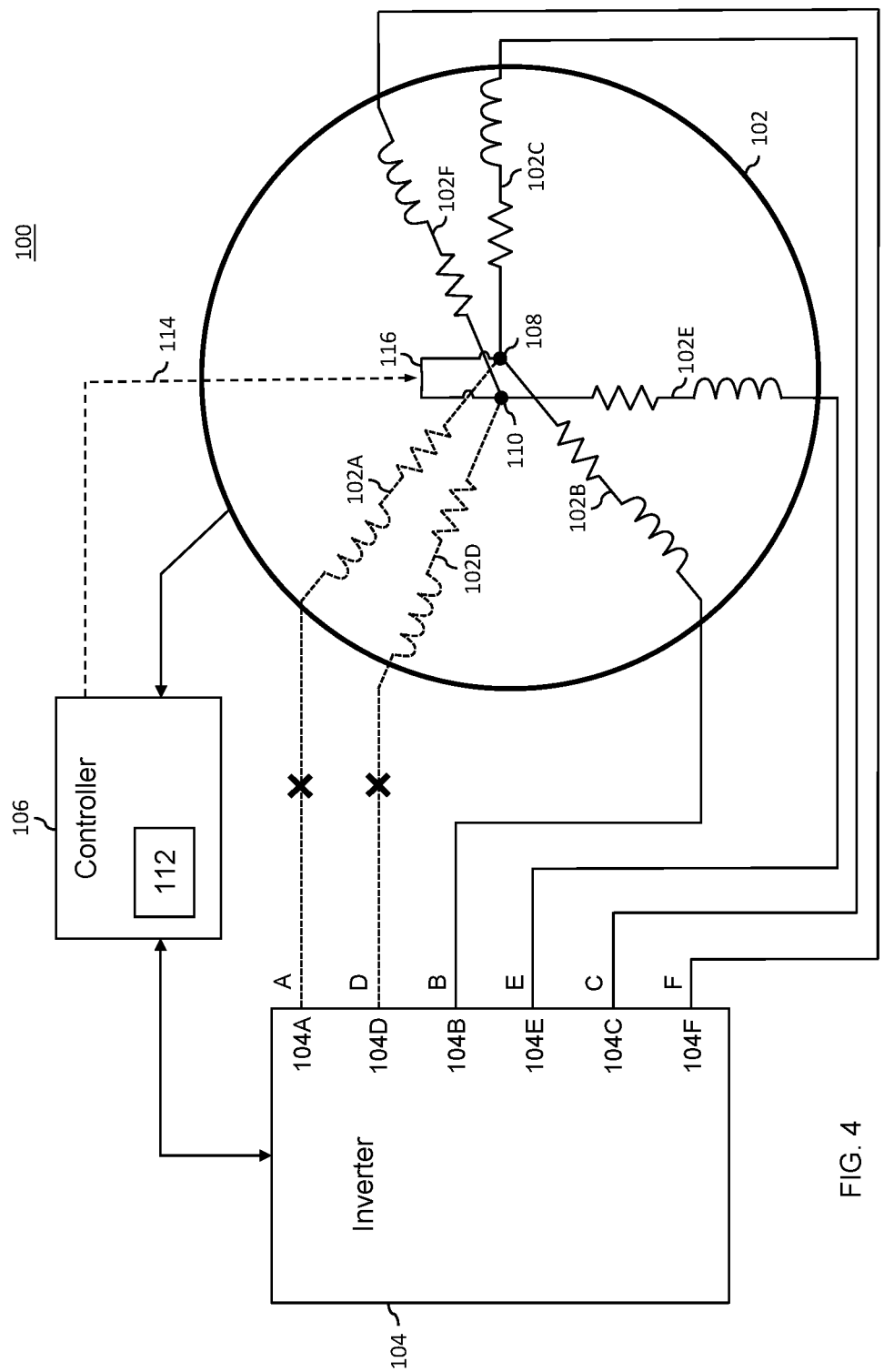
FIG. 4 is a block diagram illustrating a fault occurring in two of the six phases in the six-phase machine of FIG. 1.

In another example, the fault occurs in one phase in both the first group and the second group. As such, the controller combines the first and second neutral connections and operates the six-phase machine a four-phase machine. As an illustration, FIG. 4 shows a fault occurring in phases A and D (windings 102A and 102D) of six-phase AC machine 102. As a result, controller 106 generates signal 114 to close switch 116. In doing so, neutral connections 108, 110 are joined together to form a common neutral connection. Using the common neutral connection, controller 106 can control the currents flowing through other phases B, C, E, F (windings 102B, 102C, 102E, 02F) and operate six-phase AC machine 102 in a four-phase configuration.

In one embodiment, the six-phase machine includes a stator and a rotor separated by an air gap. As such, application of AC power to the stator causes a rotating magnetic field to be setup around the rotor. This in turn creates a magnetomotive force (MMF) in the air gap. Using the common neutral connection, controller can control a current to be provided to the six-phase machine to generate a modified MMF. This modified MMF can approximate a MMF that was generated by the six-phase machine before the occurrence of the fault. In this manner, even with the fault, the six-phase machine can continue to match or meet the required torque demands.

As described herein, controller 106 offers maximum electromagnetic controllability to operate six-phase AC machine 102 when one or more phases have experienced a fault or failure condition. This further enhances the fault tolerant capabilities of six-phase AC machine 102 for reliable use in a variety of applications such as in electric vehicles and the aerospace industry.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more."

Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

Systems, methods and apparatus are provided herein. In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic with the benefit of this disclosure in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   operating, by a controller, a six-phase machine with six phases that are configured into a first group having a first neutral connection and a second group having a second neutral connection;
   determining, by the controller, whether at least one of the six phases is experiencing a fault; and
   in response to determining that at least one of the six phases is experiencing a fault, combining, by the controller, the first and second neutral connections to form a common neutral connection to continue operating the six-phase machine using remaining phases that are not experiencing the fault,
   wherein combining the first and second neutral connections includes operating a switch to connect the first and second neutral connections into the common neutral connection.

2. The method of claim 1, wherein the fault occurs in one phase in either the first group or the second group and operating the six-phase machine using the remaining phases includes operating the six-machine as a five-phase machine.

3. The method of claim 1, wherein the fault occurs in one phase in both the first group and the second group and operating the six-phase machine using the remaining phases includes operating the six-machine as a four-phase machine.

4. The method of claim 1, further comprising detecting a fault condition causing the fault and generating a signal to indicate the fault condition.

5. The method of claim 1, wherein operating the six-phase machine using the remaining phases includes providing a current to generate a modified magnetomotive force (MMF) to approximate a MMF that was generated by the six-phase machine before the occurrence of the fault.

6. A controller, comprising:
   a processor; and
   a memory including instructions that, when executed by the processor, cause the controller to:
   operate a six-phase machine with six phases that are configured into a first group having a first neutral connection and a second group having a second neutral connection;
   determine whether at least one of the six phases is experiencing a fault; and
   in response to determining that at least one of the six phases is experiencing a fault, combine the first and second neutral connections to form a common neutral connection to continue operating the six-phase machine using remaining phases that are not experiencing the fault, wherein the instructions further cause the controller to operate a switch to connect the first and second neutral connections into the common neutral connection.

7. The controller of claim 6, wherein the fault occurs in one phase in either the first group or the second group and the instructions, when executed by the processor, to cause the controller to operate the six-phase machine using the remaining phases further cause the controller to operate the six-machine as a five-phase machine.

8. The controller of claim 6, wherein the fault occurs in one phase in both the first group and the second group and the instructions, when executed by the processor, to cause the controller to operate the six-phase machine using the remaining phases further cause the controller to operate the six-machine as a four-phase machine.

9. The controller of claim 6, wherein the instructions, when executed by the processor, further cause the controller to detect a fault condition causing the fault and generate a signal to indicate the fault condition.

10. The controller of claim 6, wherein the instructions, when executed by the processor, to cause the controller to operate the six-phase machine using the remaining phases further cause the controller to provide a current to generate a modified magnetomotive force (MMF) to approximate a MMF that was generated by the six-phase machine before the occurrence of the fault.

11. A system, comprising:
a six-phase machine with six phases that are configured into a first group having a first neutral connection and a second group having a second neutral connection;
a switch; and
a controller coupled to the six-phase machine, the controller configured to:
operate the six-phase machine;
determine whether at least one of the six phases is experiencing a fault; and
in response to determining that at least one of the six phases is experiencing a fault, combine the first and second neutral connections to form a common neutral connection to continue operating the six-phase machine using remaining phases that are not experiencing the fault,
wherein the controller is further configured to combine the first and second neutral connections by operating the switch to connect the first and second neutral connections into the common neutral connection.

12. The system of claim 11, wherein the fault occurs in one phase in either the first group or the second group and the controller is configured to operate the six-phase machine using the remaining phases by operating the six-machine as a five-phase machine.

13. The system of claim 11, wherein the fault occurs in one phase in both the first group and the second group and the controller is configured to operate the six-phase machine using the remaining phases by operating the six-machine as a four-phase machine.

14. The system of claim 11, wherein the controller is further configured to detect a fault condition causing the fault and generate a signal to indicate the fault condition.

15. The system of claim 11, wherein the controller is configured to operate the six- phase machine using the remaining phases by providing a current to generate a modified magnetomotive force (MMF) to approximate a MMF that was generated by the six-phase machine before the occurrence of the fault.

\* \* \* \* \*